United States Patent [19]

Moriyama et al.

[11] Patent Number: 4,851,682
[45] Date of Patent: Jul. 25, 1989

[54] PYROELECTRIC INFRARED SENSOR

[75] Inventors: Nobuhiro Moriyama; Tetsuaki Kon; Aisaku Nagai, all of Iwaki, Japan

[73] Assignee: Kureha Kagaku Kogyo Kabushiki Kaisha, Tokyo, Japan

[21] Appl. No.: 168,317

[22] Filed: Mar. 18, 1988

[30] Foreign Application Priority Data

Mar. 20, 1987 [JP] Japan .................................. 62-67317

[51] Int. Cl.[4] .............................................. G01J 5/00
[52] U.S. Cl. ................................ 250/338.3; 250/338.1
[58] Field of Search ........................... 250/338.3, 338.1

[56] References Cited

U.S. PATENT DOCUMENTS

| | | | |
|---|---|---|---|
| 3,769,096 | 10/1973 | Ashkin et al. ................. | 250/338.3 X |
| 3,772,518 | 11/1973 | Murayama et al. ......... | 250/338.3 X |
| 3,798,473 | 3/1974 | Murayama et al. ................. | 310/334 |
| 3,809,920 | 5/1974 | Cohen et al. ................. | 250/338.3 X |
| 4,577,132 | 3/1986 | Ohigashi et al. ..................... | 310/800 |

FOREIGN PATENT DOCUMENTS 79124  4/1986  Japan ................................. 250/338.3

OTHER PUBLICATIONS

Keigorô Shigiyama, "PVDF Pyroelectric Infrared Detector." National Technical Report, vol. 26, No. 3 (Jun. 1980) pp. 517-525.
Ruland, W. *Acta, Cryst.* (1961) 14, pp. 1180-1185 "X-ray Determination of Crystallinity and Diffuse Disorder Scattering".

Primary Examiner—Janice A. Howell
Assistant Examiner—Constantine Hannaher
Attorney, Agent, or Firm—Wenderoth, Lind & Ponack

[57] ABSTRACT

A polymer pyroelectric infrared sensor having an improved sensitivity and an improved heat resistance is formed by disposing a pyroelectric film having electrodes for taking out a pyroelectric output on both sides so as to face a window for introducing infrared rays. The pyroelectric film comprises a pyroelectric film of vinylidene fluoride copolymer having a crystallinity of 60% or more and a relative dielectric constant of 10 or below at 25° C. and in a low frequency region of 0.1-10 Hz.

12 Claims, 5 Drawing Sheets

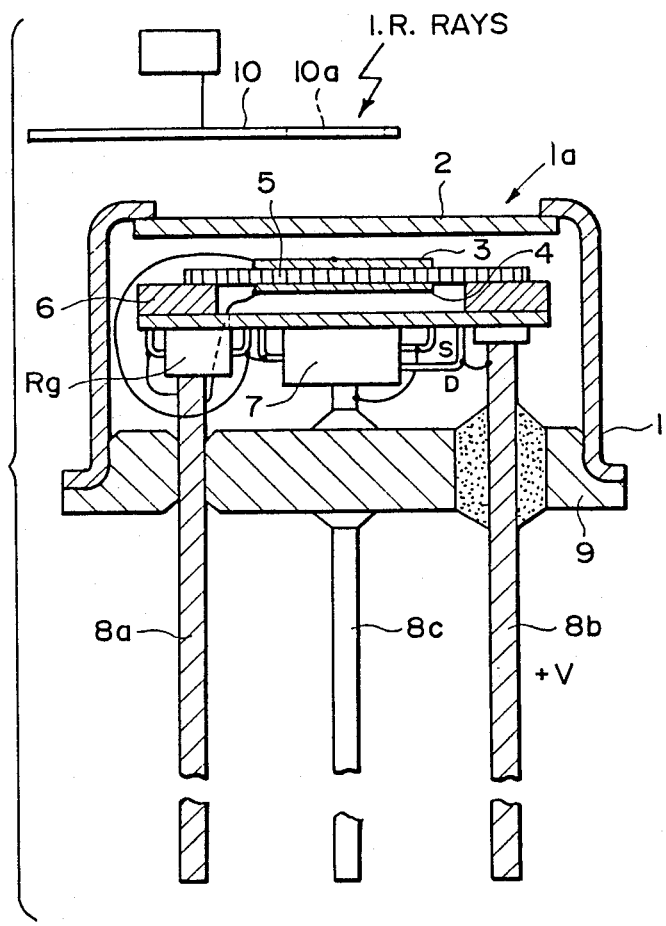
FIG. IA
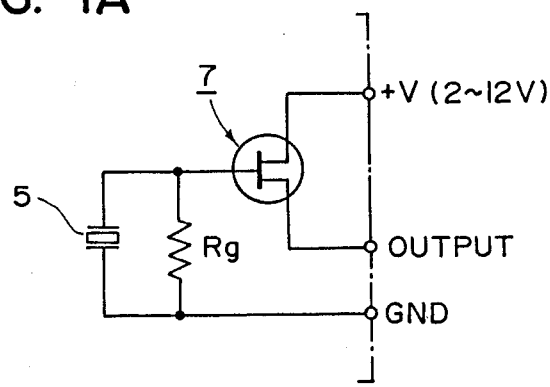
FIG. IB

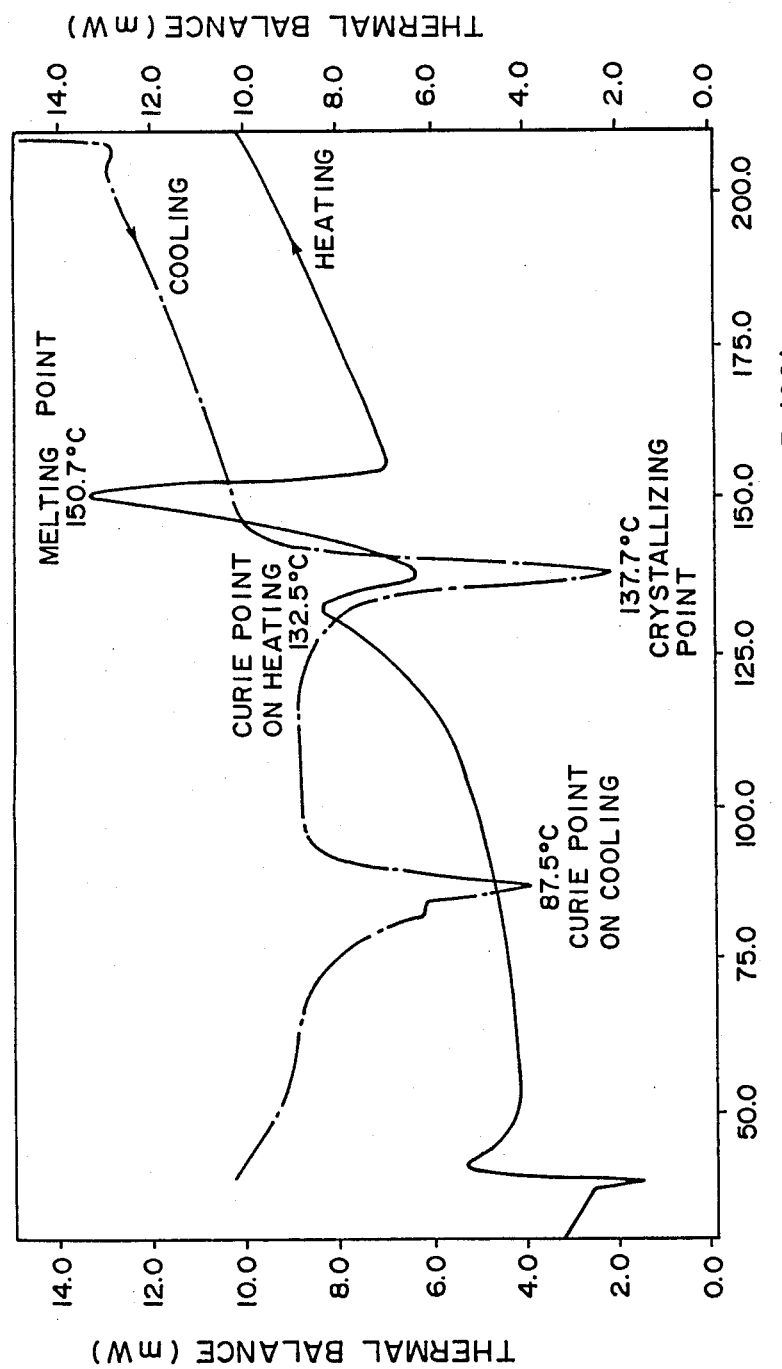
FIG. 2  THERMAL ANALYSIS BY DSC (EXAMPLE 1)

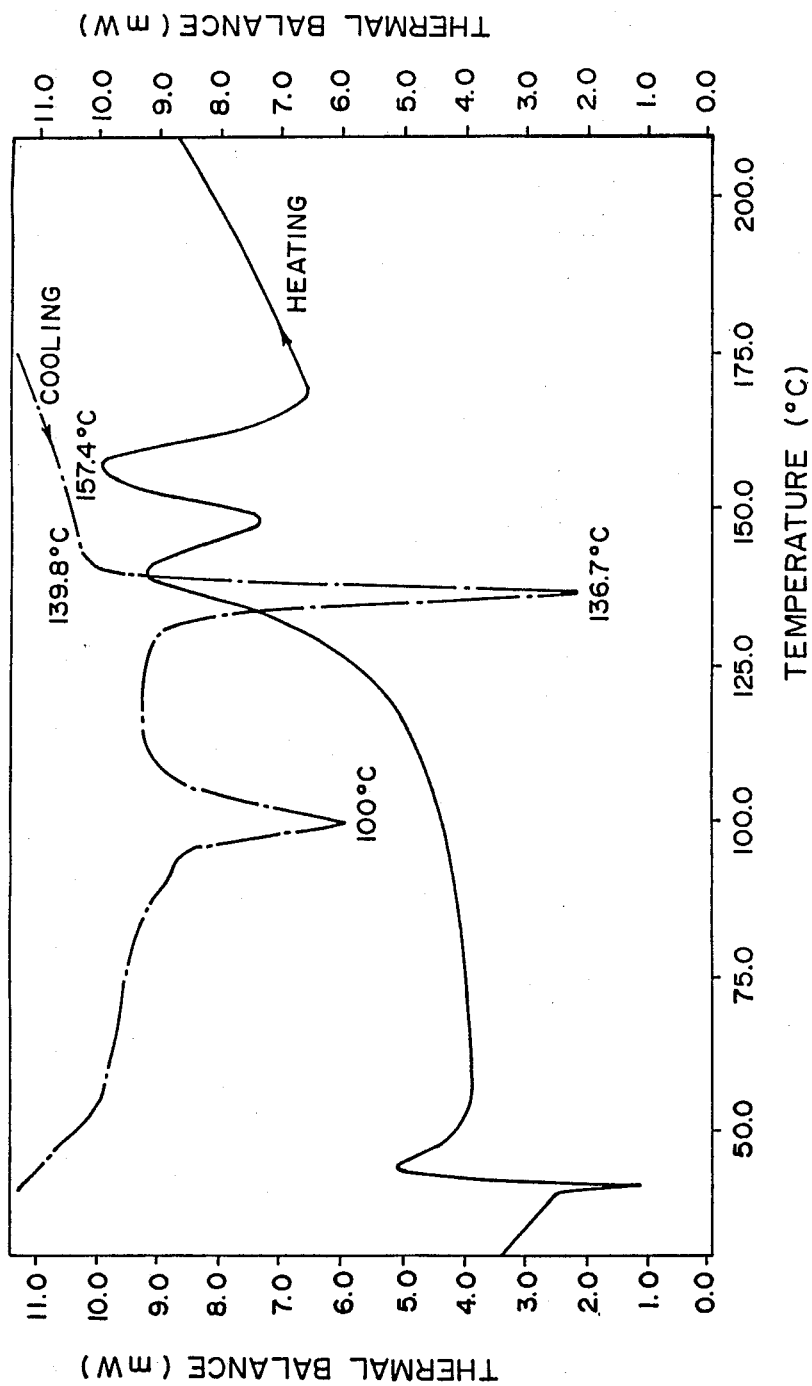
FIG. 3 THERMAL ANALYSIS BY DSC (EXAMPLE 2)

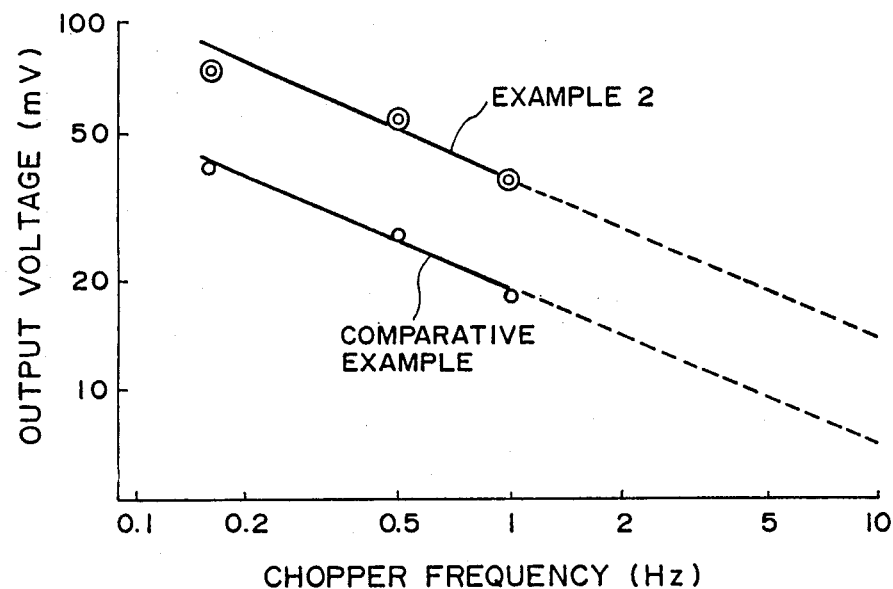
FIG. 5
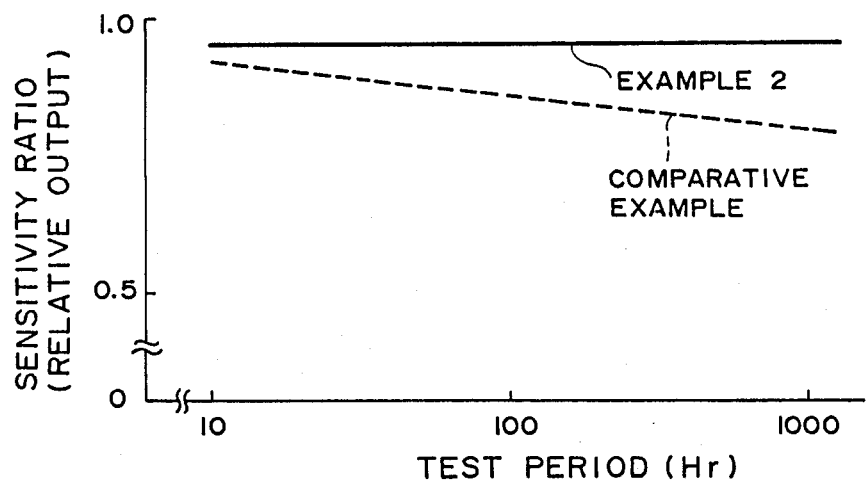
FIG. 6  HEAT RESISTANCE TEST (85°C)

PYROELECTRIC INFRARED SENSOR

FIELD OF THE INVENTION AND RELATED ART

The present invention relates to a polymer pyroelectric infrared sensor with improved sensitivity and heat resistance.

A pyroelectric infrared sensor generally has a basic structure wherein a pyroelectric element comprising a film or sheet of a pyroelectric material having a spontaneous polarization and electrode films formed on both faces of the pyroelectric material is used as a heat-sensing element, and an electric field generated by a change in spontaneous polarization caused by a temperature change depending on a change in quantity of incident infrared rays is detected after amplification as desired.

Pyroelectric materials used heretofore constituting such infrared sensors are shown in the following Table 1 together with their physical properties.

TABLE 1

| | Physical properties of pyroelectric materials | | | | |
|---|---|---|---|---|---|
| Material | Pyroelectric constant $\lambda(C/cm^2 \cdot K)$ | Curie temp. $T_c(°C.)$ | Relative dielectric constant $\epsilon_r$ (1 Hz) | Specific heat at constant volume $C_v(J/cm^3 \cdot K)$ | Performance index $\lambda/\epsilon_r \cdot C_v (C \cdot cm/J)$ |
| PbTiO$_3$ | $6 \times 10^{-8}$ | 470 | 200 | 3.1 | $96 \times 10^{-12}$ |
| LiNbO$_3$ | $0.5 \times 10^{-8}$ | 1210 | 31 | 3.0 | $54 \times 10^{-12}$ |
| LiTaO$_3$ | $2.3 \times 10^{-8}$ | 618 | 54 | 3.2 | $130 \times 10^{-12}$ |
| SBN | $6.5 \times 10^{-8}$ | 115 | 380 | 2.1 | $82 \times 10^{-12}$ |
| PZT | $2.0 \times 10^{-8}$ | 270 | 1800 | 2.4 | $5 \times 10^{-12}$ |
| PVDF | $0.39 \times 10^{-8}$ | — | 13.4 | 2.3 | $126 \times 10^{-12}$ |

As is understood from the above Table 1, polyvinylidene fluoride (herein sometimes indicated as "PVDF") as a pyroelectric polymer, when compared with inorganic pyroelectric materials represented by LiTaO$_3$, has a smaller pyroelectric constant $\lambda$ but also has a smaller dielectric constant, so that PVDF shows a high performance index $\alpha = \lambda/\epsilon_r \cdot C_v$ (Cv: specific heat at constant volume) which is substantially equal to that of LiTaO$_3$ showing the highest performance index among the inorganic pyroelectric materials. Accordingly, PVDF is expected to be widely used as a pyroelectric element. However, PVDF does not show a Curie temperature as a measure of upper limit temperature for stable operation, and the pyroelectricity thereof is irreversibly and rapidly lowered at a temperature close to the temperature (generally, 60–120° C.) of polarization for providing the pyroelectricity. As a result, the utilization of PVDF as a pyroelectric material has been restricted in view of its inferior heat resistance or heat stability. Moreover, an inferior heat-resistance is inherent to a polymer pyroelectric material to some extent, so that an improvement in sensitivity (performance index) compensating the defect and even providing a surplus profit is desired.

SUMMARY OF THE INVENTION

Accordingly, a principal object of the present invention is to provide a pyroelectric infrared sensor using a pyroelectric polymer element having improved sensitivity and heat-resistance.

According to our study, it has been discovered that a vinylidene fluoride copolymer film having an increased crystallinity through an appropriate heat treatment shows a clear Curie temperature on temperature increase and retains its pyroelectricity up to the vicinity of the Curie temperature, thus showing an improved heat resistance which is not attained by a conventional PVDF pyroelectric film. It has been also found that such a vinylidene fluoride copolymer film having an increased crystallinity shows a remarkable increase in performance index through a remarkable decrease in dielectric constant in a low frequency region where it is used as a pyroelectric material.

The pyroelectric infrared sensor according to the present invention is based on the above knowledge and more specifically comprises a pyroelectric film having electrodes for taking out a pyroelectric output on both sides thereof and disposed to face a window for introducing infrared rays, said pyroelectric film comprising a polarized film of vinylidene fluoride copolymer having a crystallinity of 60% or more and a relative dielectric constant of 10 or below at 25° C. and in a low frequency region of 0.1–10 Hz.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1A is a front sectional view of an embodiment of the infrared sensor according to the present invention, FIG. 1B is an equivalent circuit diagram of the infrared sensor;

FIGS. 2 and 3 are DSC charts of pyroelectric films obtained in Examples 1 and 2, respectively;

FIG. 5 is a graph showing measured output characteristics of infrared sensors incorporating elements comprising pyroelectric films of Example 2 and Comparative Example; and FIG. 6 is a graph showing the results of a heat resistance test at 85° C. with respect to the same infrared sensors.

DETAILED DESCRIPTION OF THE INVENTION

Figure 4:
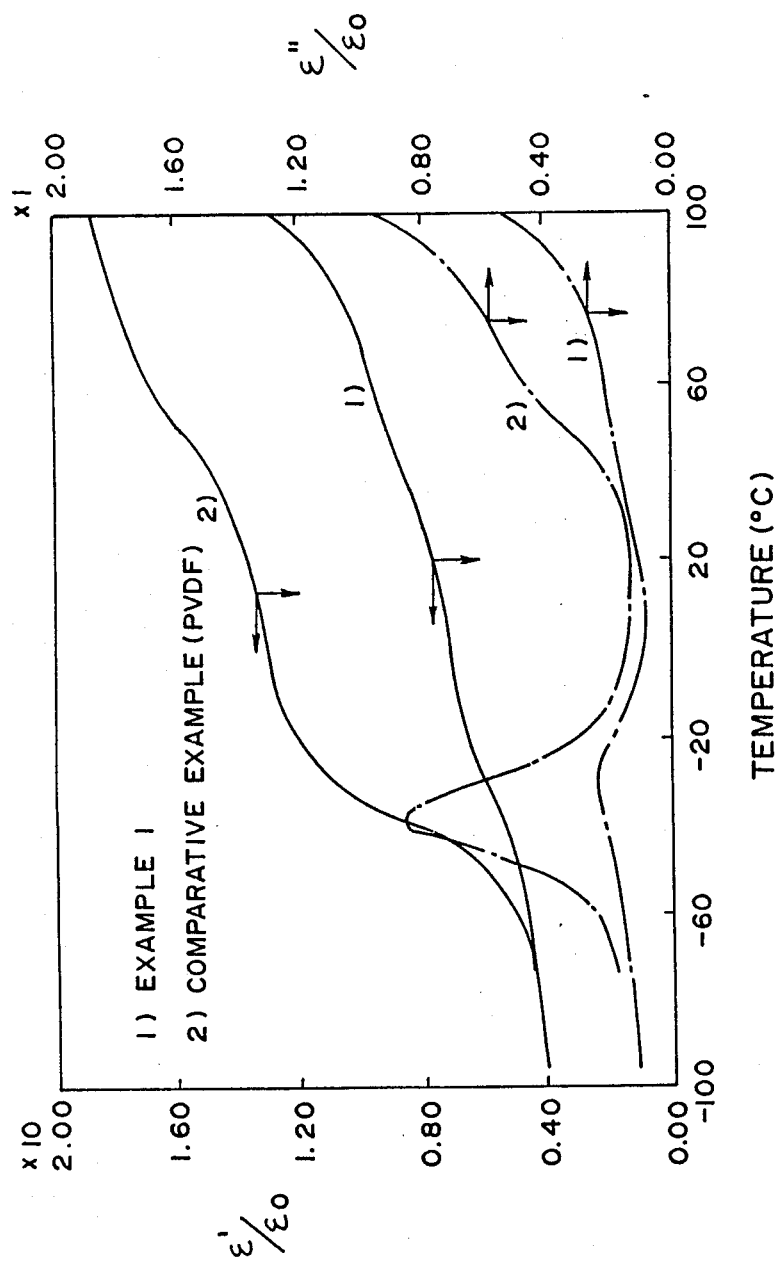
FIG. 4 is a graph showing the temperature dependency of the complex dielectric constants of pyroelectric films of Example 1 and Comparative Example.

The pyroelectric film used in the infrared sensor according to the invention comprises a copolymer of vinylidene fluoride as a predominant component, preferably in a proportion of 37–95 mol %, particularly 55–90 mol %, and has a crystallinity of 60% or more, and a relative dielectric constant of 10 or below at 25° C. and in a low-frequency region of 0.1–10 Hz. It is further preferred that the pyroelectric film shows a Curie temperature of 100° C. or higher, particularly 120° C. or higher, on temperature increase. The Curie temperature refers to a temperature providing an endothermic peak or shoulder on the lower temperature side than the melting point of the DSC (differential scanning calorimeter) curve on temperature increase at a temperature-increasing rate of 10° C./min. It is also preferred that the imaginary part of the complex dielectric constant in the temperature range of −100° C. to 0° C. is 0.6 or below.

The comonomer to be copolymerized with vinylidene fluoride may be any one in principle as far as it is copolymerizable with vinylidene fluoride to provide a copolymer film showing the above-mentioned crystallinity and relative dielectric constant. The comonomer may preferably be a fluorine-containing monomer, such as ethylene trifluoride, vinyl fluoride, tetrafluoroethylene, or trifluorochloroethylene. This is because the formation of a stable β-crystals in a vinylidene fluoride copolymer is largely concerned with the inclusion of a different monomer species. A binary or ternary copolymer is preferred but a copolymer of more species may possibly be used containing minor components up to, e.g., about 40 mol %.

Optional additives, such as an inorganic filler, an infrared absorber and a crystal nucleating agent, may be added to the vinylidene fluoride copolymer.

The vinylidene fluoride copolymer is used in the form of a film having a thickness of, e.g., 0.1 to 1000 microns. For the purpose of film formation, any process may be applied, inclusive of extrusion, pressing, and rolling. A particularly preferred process may be casting. It is especially preferred to subject the film to heat treatment in order to increase the crystallinity and lower the relative dielectric constant of the film. The heat treatment may be effected by holding the film at a temperature between the crystallizing temperature and the melting point of the vinylidene fluoride copolymer. Herein, the melting point refers to the highest temperature providing an endothermic peak on a DSC (differential scanning calorimeter) curve on temperature increase at a temperature-increasing rate of 10° C./min. The crystallizing point refers to the highest temperature providing an exothermic peak on the DSC curve on temperature decrease at a temperature-decreasing rate of 10° C./min. The heat treatment may be effected for 30 minutes or more, preferably 2 hours or more, in order to accomplish the crystallization as completely as possible. The upper limit of the time for the heat treatment is determined only from the viewpoint of production efficiency and may ordinarily be two days or shorter.

Through the heat treatment, there is obtained a vinylidene fluoride copolymer film having: a crystallinity of 60% or more, preferably 80% or more, particularly preferably 90% or more; a relative dielectric constant at 25° C. (0.1–10 Hz) of 10 or below, preferably 9 or below; and preferably a complex dielectric constant having an imaginary part of 0.6 or below, more preferably 0.4 or below, particularly preferably 0.3 or below, in the temperature range of −100° C. to 0° C.

Herein, the crystallinity of the vinylidene fluoride copolymer film is determined by analyzing the X-ray diffraction pattern according to the Ruland method. (W. Ruland; Acta Cryst. (1961) 14, 1180–1185). The above-mentioned peak in the imaginary part of the complex dielectric constant in the temperature region of −100° C. to 0° C. is based on the presence of a noncrystalline portion. The complex dielectric constant is based on measured values obtained by using Rheolograph Solid available from Toyo Sokki K.K.

After or in parallel with the heat treatment, an electric field is applied to the film to effect orientation polarization. The conditions for this treatment are substantially the same as those adopted in production of polyvinylidene fluoride piezoelectric films. For example, the polarization is effected by applying a voltage of 10 KV/cm or above and below the breakdown voltage for more than switching time (e.g. about 5 micro-seconds) of rotation of dipoles in crystal.

Incidentally, heat-treatment of a vinylidene fluoride copolymer film for increasing the crystallinity has been already carried out in the field of piezoelectric materials. Particularly, it has been proposed to use a heat-treated vinylidene fluoride copolymer film in order to provide a piezoelectric film for ultrasonic transducers having an increased electromechanical coupling coefficient $k_t$ in the direction perpendicular to the film surface in a high frequency region [JP-B (Tokko Sho) 51-23439 corresponding to U.S. Pat. No. 3,798,483; JP-A (Tokkai No. Sho) 56-111281 corresponding to U.S. Pat. No. 4,577,143, etc.]. In view of the fact that PVDF is not only an excellent piezoelectric material but also a useful pyroelectric material, one might well have conceived the use of the above-mentioned vinylidene fluoride copolymer film as a pyroelectric material. Heretofore, however, no vinylidene fluoride copolymer film as described above has been practically used as a high-sensitivity pyroelectric material. This may be attributable to the following reasons.

(1) No increase in performance as a pyroelectric material through copolymerization was recognized. In fact, even the pyroelectric film comprising a vinylidene fluoride copolymer according to the present invention, when compared with PVDF film with respect to a pyroelectric constant $\lambda(C/cm^2K)$ alone, shows a pyroelectric constant which is not better than but is somewhat worse than that of the PVDF film (as shown in Examples appearing hereinafter). Accordingly, it is assumed that the practical use of a vinylidene fluoride copolymer film as a pyroelectric material has been prevented because no attention has been paid to the improved performance in terms of a performance index in which the change in dielectric constant has been taken into consideration.

(2) The vinylidene fluoride copolymer film as described above was developed as a material for an ultrasonic transducer element wherein the high-frequency characteristic was much thought of, whereas PVDF and vinylidene fluoride copolymer were not substantially different with respect to the relative dielectric constant in the high frequency region (as shown in Examples appearing hereinafter). As a result, it has not been sufficiently recognized that a vinylidene fluoride copolymer having an increased crystallinity shows a remarkably smaller relative dielectric constant in the low frequency region.

(3) When the use of a film material for an ultrasonic transducer element is considered, the increase in crystallinity results in fragility of the film. As a result, the increase in crystallinity must be rather suppressed within an extent that an increase in $k_t$ is attained. For this reason, a sufficient increase in crystallinity was not realized in the conventional vinylidene fluoride copolymer film, so that the effect of the present invention was not attained either.

According to our study, however, it has been found that a vinylidene fluoride copolymer film having an increased crystallinity shows a remarkably low relative dielectric constant which is ⅔ or less of that of PVDF film in the low frequency region on the order of 0.1-10 Hz where the performance of a pyroelectric element is questioned, thus providing a remarkable increase in performance. It has been also found that such a vinylidene fluoride copolymer film having an increased crystallinity shows a remarkably improved heat resistance. Thus, we have accomplished the present invention.

FIG. 1A is a front sectional view in a somewhat schematic form of an embodiment of the infrared sensor according to the present invention wherein such a pyroelectric film as described above is incorporated. FIG. 1B is an equivalent circuit diagram of the same.

Referring to FIG. 1A, the infrared sensor comprises a metal case (cap) 1 with a window opening 1a for introducing infrared rays at its top, in which a window member 2 for passing infrared rays composed of, e.g., of a silicon plate or a polyethylene sheet, is disposed to close the opening 1a. Below the window member 2 is disposed a pyroelectric element 5 according to the present invention, which comprises a vinylidene fluoride copolymer film having a thickness of, e.g., 0.1-1000 microns and having thereon a front electrode 3 on the light-receiving side of, e.g., ITO (indium-tin-oxide) or Ni-Cr in a thickness of, e.g., 0.001-1 micron and a back electrode 4 on the other side of, e.g., a transparent conductor such as ITO or an intransparent conductor such as Al or Ni—Cr having a thickness of, e.g., 0.01 micron or more. The element 5 is affixed onto a fixing ring 6 by means of an adhesive, etc., the light-receiving side electrode 3 is connected to the gate of an FET 7 (N-type in this embodiment), and the back electrode is grounded through a lead wire 8a. In parallel with the element 5, a resistor Rg is inserted between the gate and the ground. On the other hand, the drain of the FET 7 is connected to a voltage supply of +V (e.g., 2-12 volts) through a lead wire 8b, and the source is connected to a lead wire 8c for output. Further, the respective parts described above are affixed as by bonding to a base plate 9 by the medium of the lead wires 8b, 8c, etc., and the lower end of the cap 7 is bonded to the base plate 9 to provide a generally closed structure.

The operation of the infrared sensor of the structure described above will now be described. A chopper 10 is generally disposed in front of the window 1a and rotates at a low frequency of 0.1-10 Hz. Infrared rays incident through an opening 10a in the shape of, e.g., a sector, of the chopper 10 provide the element 5 with a temperature change corresponding to the incident quantity of the rays. As a result, an electric field is generated between both faces of the element corresponding to a change in polarization due to the temperature change and is subjected to impedance conversion by the FET 7 to be output from the source of the FET.

Hereinbelow, the present invention will be more specifically described with reference to the examples.

Example 1

A copolymer having a composition substantially equal to that of the polymerization feedstock of 73 mol % of vinylidene fluoride, 22 mol % of ethylene trifluoride and 5 mol % of vinyl fluoride and an $\eta$inh (inherent viscosity as measured in a dimethylformamide solution at a concentration of 0.4 g/dl at 30° C.) of 1.23 dl/g was melt-extruded through a T-die to form a 50 micron-thick film. The DSC chart (temperature-raising and cooling rate of 10° C./min) is given in FIG. 2 which shows the presence of a clear Curie temperature. The film was heat-treated at 148° C. for 2 hours, followed by orientation polarization for 30 minutes at 90° C. and a field intensity of 100 MV/m, and then cooled to room temperature while the field was continually applied. The crystallinity of the film thus obtained was measured to be 82% as a result of analysis of the X-ray diffraction pattern of the film according to the Ruland method by using a computer.

Example 2

A copolymer having a composition substantially equal to that of the polymerization feedstock of 77 mol % of vinylidene fluoride, 21 mol % of ethylene trifluoride and 2 mol % of vinyl fluoride and an $\eta$inh of 3.08 was cast into a 30 microns-thick film. The DSC chart of the film is given in FIG. 3 which shows a clear Curie temperature similarly as the film of Example 1.

The film was heat-treated at 148° C. for 2 hours and then subjected to orientation polarization in the same manner as in Example 1. The crystallinity of the film thus obtained was measured to be 95% in the same manner as in Example 1.

The pyroelectric constants, relative dielectric constants at 1 Hz and 50 MHz and performance indexes of the pyroelectric films prepared in the above Examples were measured and are shown in the following Table 2 together with those of a commercially available PVDF pyroelectric film (the one shown in the previous Table 1, Trade Name "Polyvinylidene Fluoride PyroFilm", available from Kureha Kagaku Kogyo K.K.).

TABLE 2

| | Pyroelectric constant C/cm²K | Relative dielectric constant $\epsilon_r$ | | Performance index Ccm/J |
| --- | --- | --- | --- | --- |
| | | 1 Hz | 50 MHz | |
| Example 1 | $3.61 \times 10^{-9}$ | 7.93 | 4.27 | $1.98 \times 10^{-10}$ |
| Example 2 | $3.33 \times 10^{-9}$ | 8.21 | 4.4 | $1.76 \times 10^{-10}$ |
| PVDF | $3.88 \times 10^{-9}$ | 13.4 | 4.57 | $1.26 \times 10^{-10}$ |

As is understood from the above Table 2, the pyroelectric film comprising a vinylidene fluoride copolymer according to the present invention has a pyroelectric constant which per se is rather smaller than that of the PVDF pyroelectric film but also has a strikingly smaller relative dielectric constant $\epsilon_r$ in the low frequency region, so that it provides a remarkable improvement of 40-50% in performance index as a pyroelectric element.

FIG. 4 shows the complex dielectric constants (versus temperature) of the pyroelectric film obtained by Example 1 and the one of Comparative Example (PVDF) measured by Rheolograph Solid (available from Toyo Sokki Seisakusho K.K.).

The peak on the $\epsilon''/\epsilon_0$ curve and the increase on the $\epsilon'/\epsilon_0$ curve of the comparative Example (PVDF) in the temperature range of −60° C. to 0° C. represent the molecular movement of amorphous portion in a vinylidene fluoride resin. In contrast thereto, the pyroelectric film in Example 1 according to the present invention showed a particularly small peak of $\epsilon''/\epsilon_0$ of below 0.3 (about 0.2) which represents a high crystallinity.

Performance Test

An infrared sensor having a structure explained with reference to FIGS. 1A and 1B was prepared by using a 25 micron-thick pyroelectric film prepared in the same manner as in the above Example 2 as the element 5. The output voltage of the infrared sensor was measured under the condition of an incident energy density of $2.74 \times 10^{-4}$ W/cm$^2$ while changing the chopper frequency in the range of 0.16 to 1 Hz.

The same test was conducted by using an infrared sensor incorporating an element 5 comprising the above-mentioned commercially available PVDF pyroelectric film.

The results are summarized in FIG. 5.

Further, the above two types of infrared sensors was left to stand at 85° C. and the outputs thereof were measured at certain intervals to evaluate the heat resistance of the infrared sensors. FIG. 6 shows the results in terms of the sensitivity ratios relative to the respective outputs of the infrared sensors before the heat resistance test.

The results of FIGS. 5 and 6 show that an infrared sensor according to the present invention has been remarkably improved in respects of both sensitivity and heat stability compared with an infrared sensor using a conventional PVDF element.

As described above, according to the present invention, there is provided an infrared sensor having remarkably improved sensitivity and heat resistance, wherein a pyroelectric film comprising a vinylidene fluoride copolymer having an increased crystallinity and a reduced relative dielectric constant in a low frequency region is incorporated as a pyroelectric element.

What is claimed is:

1. A pyroelectric infrared sensor, comprising: a pyroelectric film having electrodes for taking out a pyroelectric output on both sides thereof and disposed to face a window for introducing infrared rays, said pyroelectric film comprising a polarized film of vinylidene fluoride copolymer having a crystallinity of 60% or more and a relative dielectric constant of 10 or below at 25° C. and in a low frequency region of 0.1–10 Hz said pyroelectric film showing a peak of 0.6 or below in the imaginary part of the complex dielectric constant in the temperature range of $-100°$ C. to 0° C.

2. An infrared sensor according to claim 1, wherein said pyroelectric film shows a Curie temperature of 100° C. or above on temperature increase.

3. An infrared sensor according to claim 2, wherein said pyroelectric film shows a Curie temperature of 120° C. or above on temperature increase.

4. An infrared sensor according to claim 1, wherein said pyroelectric film shows a peak of 0.4 or below in the imaginary part of the complex dielectric constant in the temperature range of $-100°$ C. to 0° C.

5. An infrared sensor according to claim 1, wherein said vinylidene fluoride copolymer comprises 37 to 95 mol % of vinylidene fluoride, and a fluorine-containing monomer.

6. An infrared sensor according to claim 5, wherein said vinylidene fluoride copolymer comprises 55–90 mol % of vinylidene fluoride, and a fluorine-containing monomer.

7. An infrared sensor according to claim 5, wherein said fluorine-containing monomer is selected from the group consisting of trifluoroethylene, vinyl fluoride, tetrafluoroethylene and trifluorochloroethylene.

8. An infrared sensor according to claim 1, wherein said pyroelectric film has been obtained by heat-treating and polarizing the vinylidene fluoride copolymer film.

9. An infrared sensor according to claim 8, wherein the vinylidene fluoride copolymer film is heat-treated at a temperature in the range of from the crystallizing temperature of the vinylidene fluoride copolymer film to the melting point of the vinylidene fluoride copolymer film.

10. An infrared sensor according to claim 8, wherein the polarization is carried out by applying a voltage of 10 KV/cm or above and below the breakdown voltage.

11. An infrared sensor according to claim 1, wherein said vinylidene fluoride copolymer film has been formed by extrusion.

12. An infrared sensor according to claim 1, wherein said vinylidene fluoride copolymer film has been formed by casting.

* * * * *